(12) United States Patent
Hwang et al.

(10) Patent No.: US 10,817,701 B2
(45) Date of Patent: Oct. 27, 2020

(54) ELECTRONIC DEVICE INCLUDING SENSOR

(71) Applicant: Samsung Electronics Co., Ltd., Suwon-si, Gyeonggi-do (KR)

(72) Inventors: Byungseon Hwang, Suwon-si (KR); Deokhee Lee, Suwon-si (KR); Sunggyu Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/282,657

(22) Filed: Feb. 22, 2019

(65) Prior Publication Data

US 2019/0266381 A1  Aug. 29, 2019

(30) Foreign Application Priority Data

Feb. 23, 2018 (KR) .................. 10-2018-0022048

(51) Int. Cl.
*G06K 9/00* (2006.01)
*B32B 27/16* (2006.01)
(Continued)

(52) U.S. Cl.
CPC .......... *G06K 9/00053* (2013.01); *B32B 27/16* (2013.01); *G06F 1/1626* (2013.01);
(Continued)

(58) Field of Classification Search
CPC . G06K 9/00053; G06K 9/0004; H04M 1/026; H01L 24/29; H01L 23/29; H01L 2224/2919; G06F 1/1626; B32B 27/16
(Continued)

(56) References Cited

U.S. PATENT DOCUMENTS

2015/0212626 A1\* 7/2015 Kim ...................... G06F 1/1626
345/174
2016/0026846 A1  1/2016 Lin et al.
(Continued)

FOREIGN PATENT DOCUMENTS

JP  7-299995 A  11/1995
JP  2005-209431 A  8/2005
(Continued)

OTHER PUBLICATIONS

International Search Report dated Jun. 20, 2019, issued in International Application No. PCT/KR2019/002207.
(Continued)

*Primary Examiner* — Fernando L Toledo
*Assistant Examiner* — Adam S Bowen
(74) *Attorney, Agent, or Firm* — Jefferson IP Law, LLP

(57) ABSTRACT

An electronic device is provided. The electronic device includes a fingerprint sensor including a sensor having a surface including epoxy molding compound (EMC) resin, a first layer disposed on the surface of the sensor or above the surface of the sensor, and a second layer disposed on the first layer or above the first layer. The first layer includes a first ultraviolet (UV) hardening material having first hardness.
(Continued)

The second layer includes a second UV hardening material having second hardness greater than the first hardness and a surface of the second layer has surface roughness less than a specified value.

20 Claims, 13 Drawing Sheets

(51) Int. Cl.
    *G06F 1/16*     (2006.01)
    *H01L 23/29*     (2006.01)
    *H01L 23/00*     (2006.01)
    *H04M 1/02*     (2006.01)

(52) U.S. Cl.
    CPC ............ *G06K 9/0004* (2013.01); *H01L 23/29* (2013.01); *H01L 24/29* (2013.01); *H04M 1/026* (2013.01); *H01L 2224/2919* (2013.01)

(58) Field of Classification Search
    USPC ......................................................... 257/684
    See application file for complete search history.

(56) References Cited

U.S. PATENT DOCUMENTS

| | | |
|---|---|---|
| 2016/0311142 A1 | 10/2016 | Yoon et al. |
| 2017/0098110 A1 | 4/2017 | Kim et al. |
| 2018/0129851 A1* | 5/2018 | Hsu .......................... B05D 5/00 |

FOREIGN PATENT DOCUMENTS

| | | | |
|---|---|---|---|
| JP | 2007-219013 A | | 8/2007 |
| KR | 10-2013-0050249 A | | 5/2013 |
| KR | 10-1458893 B1 | | 11/2014 |
| KR | 10-2015-0133897 A | | 12/2015 |
| KR | 20150133897 A | * | 12/2015 |
| KR | 10-2016-0127222 A | | 11/2016 |
| KR | 10-1758249 B1 | | 7/2017 |
| KR | 10-2017-0094059 A | | 8/2017 |

OTHER PUBLICATIONS

Extended European Search Report dated Jul. 10, 2019, issued in European Application No. 19158936.5.

\* cited by examiner

ELECTRONIC DEVICE INCLUDING SENSOR

CROSS-REFERENCE TO RELATED APPLICATION(S)

This application is based on and claims priority under 35 U.S.C. § 119 to Korean patent application number 10-2018-0022048, filed on Feb. 23, 2018, in the Korean Intellectual Property Office, the disclosure of which is incorporated by reference herein its entirety.

BACKGROUND

1. Field

The disclosure relates to an electronic device including a sensor.

2. Description of Related Art

Electronic devices such as smartphones, tablet personal computers (PCs), and smart watches may be equipped with various sensors. For example, the electronic device may collect biometric information of a user through a fingerprint sensor, a biometric recognition sensor, and the like. The electronic device may provide the user with useful information, by analyzing the information collected through the sensor.

The above information is presented as background information only to assist with an understanding of the disclosure. No determination has been made, and no assertion is made, as to whether any of the above might be applicable as prior art with regard to the disclosure.

SUMMARY

When the sensing surface of a sensor (e.g., fingerprint sensor) is coated, a painting method or a heat-transfer method may be used in an electronic device. In the case of the painting method, a primer painting layer, a color layer, and an ultraviolet (UV) painting layer may be sequentially stacked on the sensor. In the case of the painting method, there may be the limitation of color implementation and there may be the limitation (crack occurring) to increase the durability (hardness) of a surface. In addition, due to the nature of the painting process, the appearance quality may be significantly different depending on the manufacturing environment.

In the heat-transfer method, a first UV hardened layer, a semi-hardened ink layer, a second UV hardened layer, and a third UV hardened layer may be sequentially stacked on the sensor. In the case of the heat-transfer method, the complexity of the structure and the process may increase the production cost, and gas may be generated in the semi-hardened ink layer during the manufacturing process. Moreover, a large number of defects (pinholes, protrusions, cracks, and the like) in appearance may occur, and the malfunction of the sensor may be caused. Accordingly, the yield of products may be low.

Aspects of the disclosure are to address at least the above-mentioned problems and/or disadvantages and to provide at least the advantages described below. Accordingly, an aspect of the disclosure is to provide a method of coating the surface of a sensor with a UV hardened material.

Additional aspects will be set forth in part in the description which follows and, in part, will be apparent from the description, or may be learned by practice of the presented embodiments.

In accordance with an aspect of the disclosure, an electronic device is provided. The electronic device includes a housing, and a fingerprint sensor including a sensor having a surface including epoxy molding compound (EMC) resin, a first layer disposed on the surface of the sensor or above the surface of the sensor, and a second layer disposed on the first layer or above the first layer. The first layer may include a first UV hardening material having a first hardness. The second layer may include a second UV hardening material having a second hardness greater than the first hardness and a surface of the second layer has surface roughness less than a specified value.

In an electronic device according to various embodiments of the disclosure, a UV bonding layer and a UV coating layer may be sequentially stacked on the sensing surface of a sensor. Since the sensing surface of the electronic device is formed without a separate heating process, the possibility of cracking is low and the appearance quality and durability of the sensing surface may be improved.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
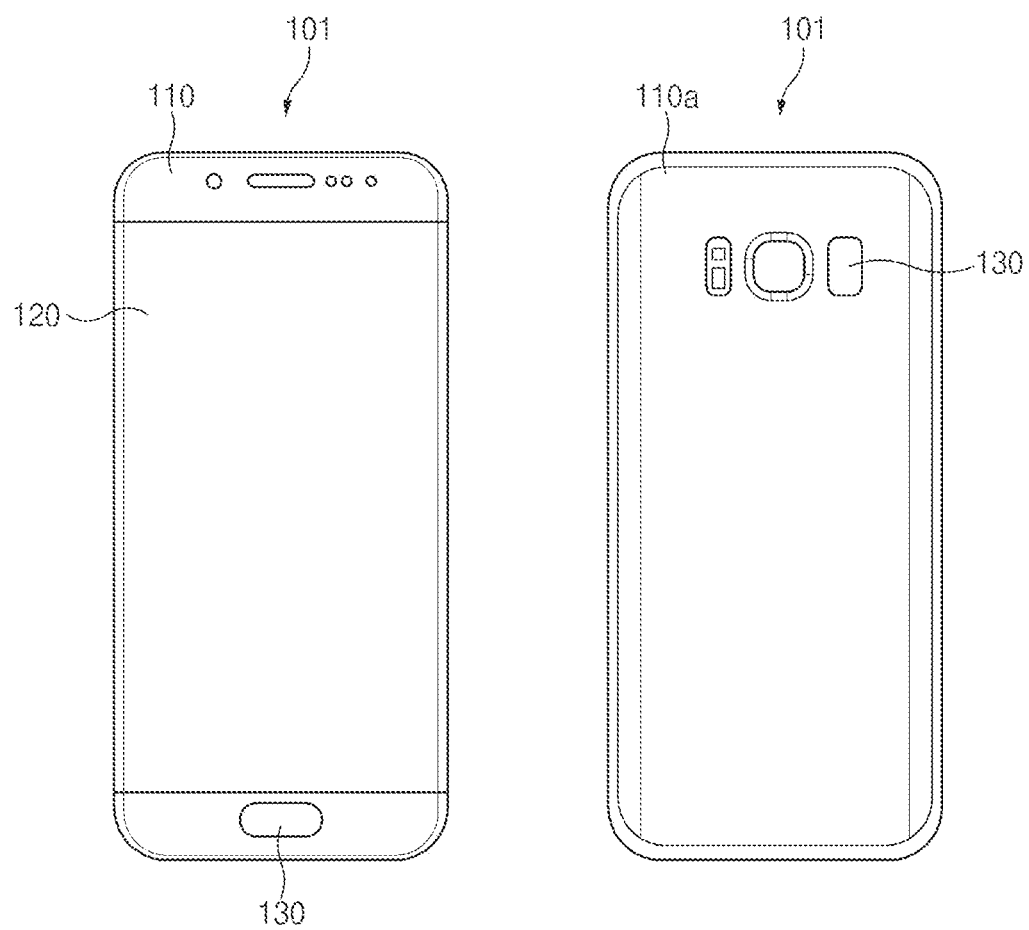
FIG. 1 illustrates an electronic device according to various embodiments of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the specification, the expressions "have", "may have", "include" and "comprise", or "may include" and "may comprise" used herein indicate existence of corresponding features (e.g., numeric values, functions, operations, or components such as parts) but do not exclude presence of additional features.

Also, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various components of various embodiments of the disclosure, but do not limit the elements. For example, "a first user device" and "a second user device" indicate different user devices regardless of the order or priority. For example, without departing the scope of the disclosure, a first complement may be referred to as a second component, and similarly, a second complement may be referred to as a first complement.

It will be understood that when a complement (e.g., a first complement) is referred to as being "(operatively or communicatively) coupled with/to" or "connected to" another complement (e.g., a second complement), it can be directly coupled with/to or connected to the other complement or an intervening complement (e.g., a third complement) may be present. In contrast, when a complement (e.g., a first complement) is referred to as being "directly coupled with/to" or "directly connected to" another complement (e.g., a second complement), it should be understood that there are no intervening complement (e.g., a third complement).

According to the situation, the expression "configured to" used herein may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor (AP)) which may perform corresponding operations by executing one or more software programs which are stored in a memory device.

Terms used in the specification are used to describe specified embodiments of the disclosure and are not intended to limit the scope of the disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the disclosure. In some cases, even though terms are terms which are defined in the specification, they may not be interpreted to exclude embodiments of the disclosure.

An electronic device according to various embodiments of the disclosure may include at least one of a smartphone, a tablet personal computer (PC), a mobile phone, a video telephone, an electronic book reader, a desktop PC, a laptop PC, a netbook computer, a workstation, a server, personal digital assistant (PDA), a portable multimedia player (PMP), a motion picture experts group (MPEG-1 or MPEG-2) Audio Layer 3 (MP3) player, a mobile medical device, a camera, or a wearable device. According to various embodiments, a wearable device may include at least one of an accessory type of device (e.g., a timepiece, a ring, a bracelet, an anklet, a necklace, glasses, a contact lens, or a head-mounted device (HMD)), a one-piece fabric or clothes type of device (e.g., electronic clothes), a body-attached type of device (e.g., a skin pad or a tattoo), or a bio-implantable type of device (e.g., implantable circuit).

Hereinafter, an electronic device according to various embodiments will be described with reference to the accompanying drawings. The term "user" used herein may refer to a person who uses an electronic device or may refer to a device (e.g., an artificial intelligence electronic device) that uses the electronic device.

FIG. 1 illustrates an electronic device, according to various embodiments of the disclosure.

Referring to FIG. 1, an electronic device 101 may include a display 110, housing (main body) 120, and a sensor 130.

The display 110 may output content such as a text, an image, or the like. The display 110 may include a display panel, a touch panel, or the like therein.

The housing (or main body) 120 may fix the display 110 and may protect various internal components. The housing 120 may include a camera, a physical button, a speaker, or the like on the outside surface of the housing.

The housing (or main body) 120 may include various components, which are necessary to drive the electronic device 101, such as a processor, a memory, a communication circuit, a printed circuit board, a battery, and the like therein.

The sensor (or a sensor module or a sensing device) 130 may collect environment information at a periphery of the electronic device 101 or information about a user. For example, the sensor 130 may collect fingerprint information, blood pressure information, and the like of a user.

According to an embodiment, when the sensor 130 is formed on the front surface of the electronic device 101 (the surface to which the content of the display 110 is output), the sensor 130 may be implemented to form at least part of a physical button (e.g., a home button). For example, the surface of the home button may be the sensing surface of the sensor 130. When the user places his/her finger on the home button, the sensor 130 may collect fingerprint information. When the sensor 130 is an optical sensor, the sensor 130 may collect light reflected from the user's finger and may convert the collected light into an electrical signal.

According to another embodiment, when the sensor 130 is formed on the rear surface of the electronic device 101 (a surface 110a opposite to the surface to which the content of the display 110 is output), a part (the sensing surface) of the sensor 130 may be exposed to the outside of the housing 120.

According to various embodiments, the sensor 130 may include a sensor part (or a sensing core, a sensor center, a sensing circuit, or the like), a UV bonding layer, an ultraviolet (UV) coating layer, and the like. The sensor part may include a sensing chip and packaging. The UV coating layer may be formed using a release film and mold. A part of the UV coating layer may be exposed to the outside of the housing 120. The additional information about the internal configuration of the sensor 130 may be provided with reference to FIG. 2.

An embodiment is exemplified in FIG. 1, as the sensor 130 is disposed on a home button of the front surface of the electronic device 101 or the rear surface of the electronic device 101. However, an embodiment is not limited thereto. For example, the sensor 130 may be formed of a power button and a volume button on the side surface. Alternatively, an opening may be formed in the housing 120 regardless of the physical button, and the sensing surface of the sensor 130 may be exposed through the opening. Hereinafter, a description will be focused on the case where the sensor 130 is applied to a home button. However, embodiments of the disclosure may not be limited thereto.

Figure 2:
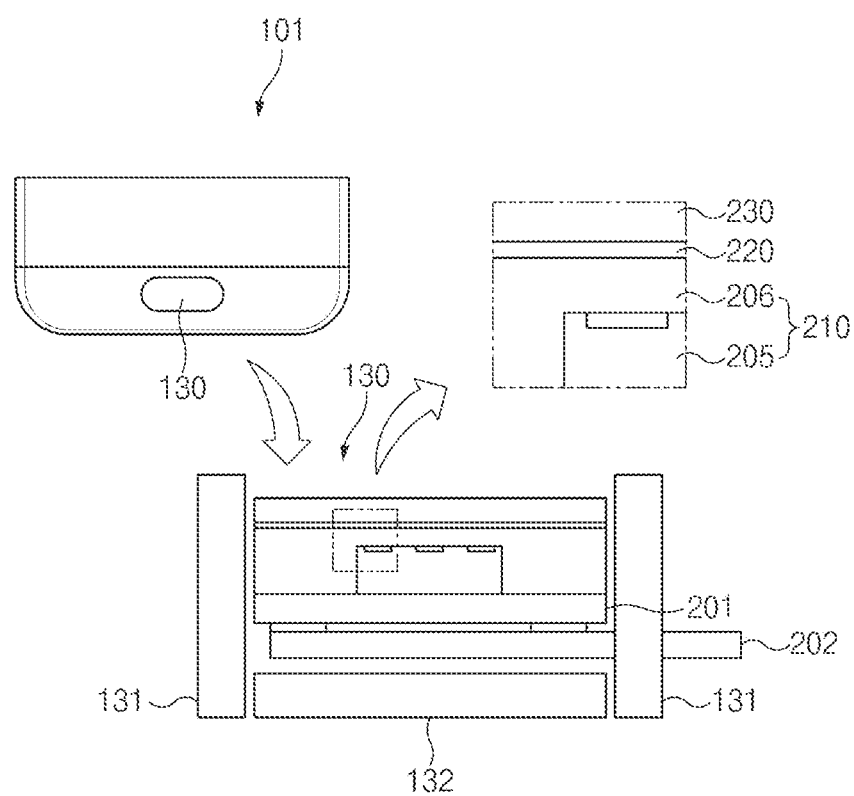
FIG. 2 is a sectional view of a sensor, according to various embodiments of the disclosure.

FIG. 2 is a sectional view of a sensor, according to various embodiments of the disclosure.

Referring to FIG. 2, the electronic device 101 may include the sensor 130. The sensor 130 may include a substrate 201, a wiring part 202, a sensor part 210, a UV bonding layer 220, and a UV coating layer 230.

The sensor part 210 may include a sensing chip 205 and packaging 206. The sensing chip 205 (e.g., wafer die) may collect sensing information and may convert the sensed information to an electrical signal. For example, the sensing chip 205 may collect light from the outside and may convert the light into an electrical signal. The sensing chip 205 may transmit the collected signal to the processor inside the electronic device 101.

The packaging 206 may fix the sensing chip 205 and may physically/chemically protect the sensing chip 205. Moreover, the packaging 206 may block the electrical power of the outside of the sensing chip 205 and the packaging 206. In an embodiment, the packaging 206 may be implemented with epoxy molding compound (EMC) resin. In an embodiment, the packaging 206 may be formed such that the packaging 206 has the thickness of 60 μm to 70 μm on the sensing chip 205.

The sensor part 210 may be fixed to the substrate 201 (e.g., printed circuit board (PCB)). The sensor part 210 may be electrically connected to an internal circuitry (e.g., a processor) of the electronic device 101 via a wiring part (e.g., flexible printed circuit board (FPCB)) 202.

The UV bonding layer 220 may be disposed between the UV coating layer 230 and the sensor part 210. The UV bonding layer 220 may be formed of a material having high bonding force with each of the UV coating layer 230 and the sensor part 210. In an embodiment, the UV bonding layer 220 may have the thickness of 1 μm to 50 μm.

The UV bonding layer 220 may be in the form of a molding liquid during the manufacturing process. The UV bonding layer 220 may be formed to harden due to UV rays input after passing through the UV coating layer 230. In an embodiment, the UV bonding layer 220 may include a material that hardens easily even at relatively low UV exposure.

After hardening, the UV bonding layer 220 may have a hardness that is not less than a specified value. In this case, the UV bonding layer 220 may protect the sensor part 210 from external impacts.

The UV coating layer 230 is disposed on the top surface of the sensor 130 such that at least part of the UV coating layer 230 may be exposed to the outside through the housing 120. In the case of biometric sensor (e.g., fingerprint sensor), the UV coating layer 230 may be a portion that a part of the body of the user contacts. In an embodiment, the UV coating layer 230 may have the thickness of 10 to 80 μm. In an embodiment, the hardness of the UV coating layer 230 may be higher than the hardness of the UV bonding layer 220.

According to an embodiment, the UV coating layer 230 may be formed of an organic/inorganic hybrid type UV-curable resin. In this case, the UV coating layer 230 may have a relatively high hardness after hardening. According to another embodiment, the UV coating layer 230 may be formed of a polymer UV-curable resin.

The UV coating layer 230 may be formed using a release film. The release film may be a transparent film having a release coating on one surface (a surface on which the UV coating layer 230 is formed). The UV coating layer 230 may be colored with the predetermined pigment or the predetermined dye, under design conditions.

According to various embodiments, the thickness of the packaging 206, the UV bonding layer 220, and the UV coating layer 230 on the sensing chip 205 may be about 50 to 200 μm.

According to various embodiments, the electronic device 101 may further include side walls 131 and a plate 132 at a periphery of the sensor 130. When the sensor 130 is implemented in the form of a home button of the electronic device 101, the side walls 131 may be distinguished from the area at a periphery of the housing. The side walls 131 may partially protrude toward the front surface of the electronic device 101. The plate 132 may be a part of the bracket of the electronic device 101 or may be a separate structure distinguished from the bracket.

Figure 3:
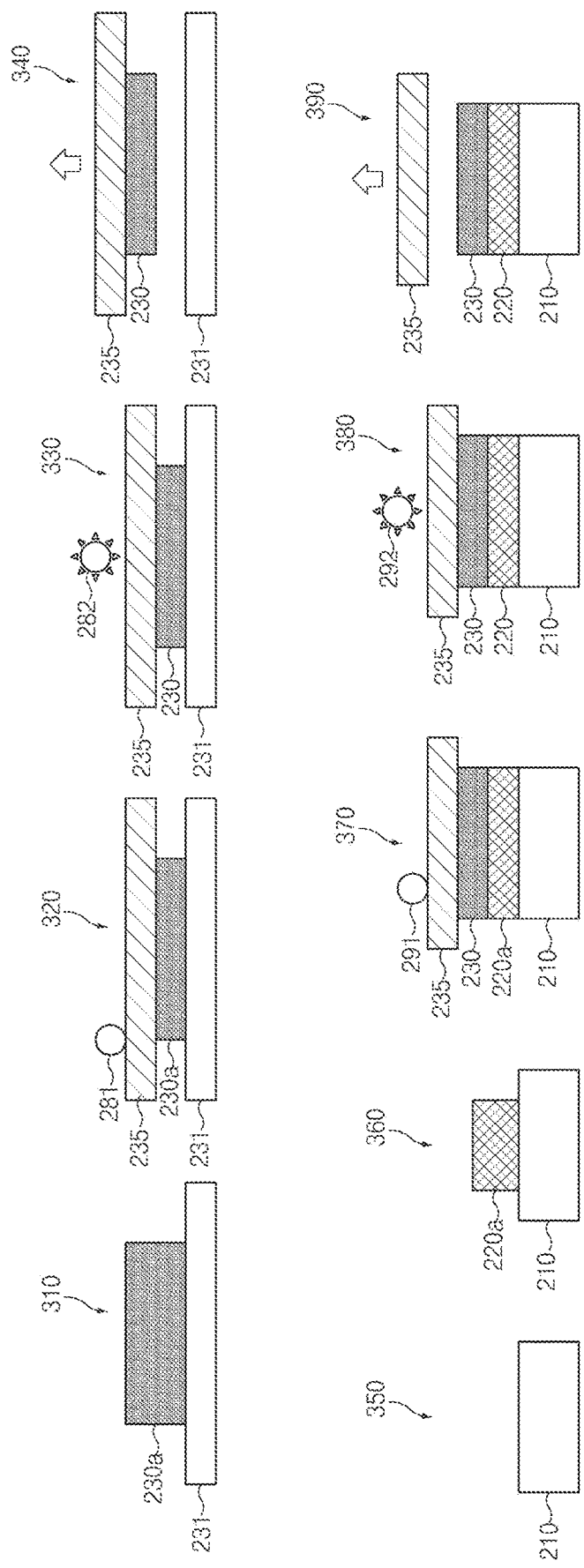
FIG. 3 is a view illustrating a process of coating a sensor, according to various embodiments of the disclosure.

FIG. 3 is a view illustrating a process of coating a sensor, according to various embodiments of the disclosure. FIG. 3 however, is not limited thereto.

Referring to FIG. 3, in process 310, UV resin (liquid state) 230a may be applied to a mold 231. The mold 231 may be a flat-type material such as metal, plastic film, and the like. The mold 231 may have a variety of surface patterns. According to an embodiment, the mold 231 may be treated (release coating treatment) as a thin film on the surface by vapor deposition, wet application, or the like.

The UV resin 230a may be in a liquid state and may be hardened when UV light is irradiated. The UV coating layer 230 may be discharged manually or automatically through a device. According to an embodiment, color pigment may be added to the UV resin 230a and the UV resin 230a may be stirred. The pigment of various colors may be added to the UV resin 230a under the design conditions.

In process 320, the release film 235 may be seated on the UV resin 230a. The release film 235 may be a transparent film such as PET. The release film 235 may be coated with a release material on one surface. The one surface coated with the release material may contact the UV resin 230a. The release material may be fluorine, silicon, melamine, or the like. In an embodiment, the release film 235 may have the thickness of 50 to 200 μm.

The other surface of the release film 235 (a surface on which the release material is not coated) may be pressed by a roller 281. The UV resin 230a between the release film 235 and the mold 231 may be spread and planarized by the forward movement of the roller 281.

In process 330, UV light 282 may be irradiated to the UV resin 230a. For example, the UV resin 230a and the release film 235 seated on the mold 231 may be injected into an UV irradiator. When the ultraviolet light having the specified amount of light or more is irradiated to the UV resin 230a, the UV resin 230a may be hardened, and the UV coating layer 230 may be formed.

In process 340, the UV coating layer 230 may be detached from the mold 231 while being coupled to the release film 235. When the release force of the release film 235 is greater than the release force of the surface of the mold 231, the UV coating layer 230 may be easily separated from the mold 231.

In process 350, the sensor part 210 may be provided. The sensor part 210 may be in the form in which a sensing chip and packaging are seated on a substrate (e.g., a PCB).

In process 360, a UV bond liquid (or UV resin) 220a may be applied to one surface (sensing surface) of the sensor part 210. The UV bond liquid 220a may be discharged manually or automatically through a device.

In process 370, the release film 235, to which the UV coating layer 230 is coupled, may be seated on the upper surface (a surface opposite to the surface facing the sensor part 210) of the UV bond liquid 220a. The UV coating layer 230 may be seated to contact the UV bond liquid 220a.

The uncoated surface of the release film 235 may be pressed by a roller 291. The UV bond liquid 220a may be spread and planarized by the forward movement of the roller 291.

In process 380, UV light 292 may be irradiated to the UV bond liquid 220a. The UV light 292 may pass through the release film 235 and the UV coating layer 230 to reach the UV bond liquid 220a. When the specified amount of UV light is irradiated to the UV bond liquid 220a, the UV bond liquid 220a may be hardened and then the UV bonding layer 220 may be formed.

In process 390, the release film 235 may be removed, and then the coating operation may be completed.

Figure 4A:
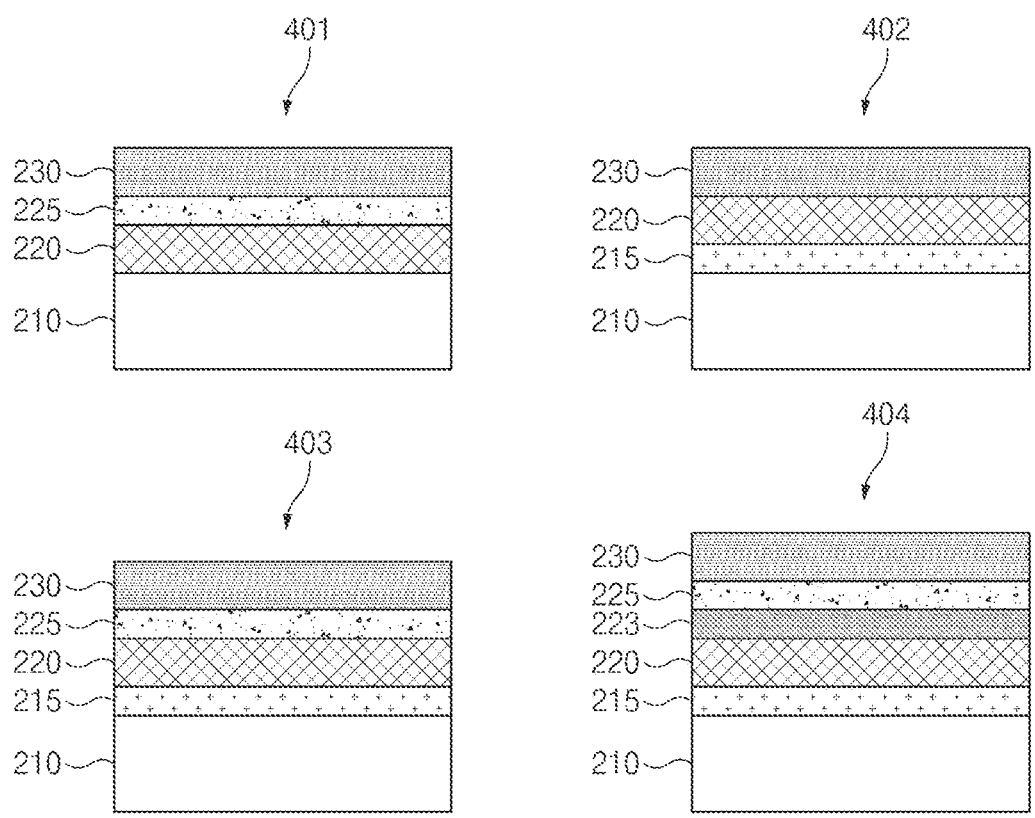
FIGS. 4A and 4B are cross-sectional views of a fingerprint sensor including various layers, according to various embodiments of the disclosure.

FIG. 4A is a cross-sectional view of a fingerprint sensor including various layers, according to various embodiments of the disclosure.

Referring to FIG. 4A, a sensor 401 may include the sensor part 210, the UV bonding layer 220, a deposition layer 225, and the UV coating layer 230. Unlike the sensor 130 of FIG. 2, the sensor 401 may further include the deposition layer 225. The deposition layer 225 may be interposed between the UV coating layer 230 and the UV bonding layer 220. In an embodiment, the deposition layer 225 may include at least one of $SiO_2$, $TiO_2$, $Ti_3O_5$, $Al_2O_3$, Indium (In), Tin (Sn), or a polymeric material.

The deposition layer 225 may change the color, brightness, and the like that is visible from the outside. The deposition layer 225 may have a high reflectance and may be implemented with a single layer or multi-layer film to obtain a metallic color or a specific color. The deposition layer 225 may be formed by a deposition process such as E-beam, or the like.

According to various embodiments, the design requirements may be satisfied by the combination of the color of the pigment included in the UV coating layer 230 and the color of the deposition layer 225. For example, the UV coating layer 230 may be colored with a yellow pigment; and when the deposition layer 225 is deposited in silver, gold may be visible from the outside.

A sensor 402 may include the sensor part 210, a color painting layer 215, the UV bonding layer 220, and the UV coating layer 230. Unlike the sensor 130 of FIG. 2, the sensor 402 may further include the color painting layer 215. The color painting layer 215 may be interposed between the sensor part 210 and the UV bonding layer 220.

The color painting layer 215 may be used when it is necessary to implement various colors including a white color or a deep color, which is difficult to implement, in a level of coloring of the deposition layer 225 and the UV coating layer 230.

According to an embodiment, when the color painting layer 215 is implemented such that a bright color such as white is visible from the outside, the color painting layer 215 may shield the color of the sensor part 210. In this case, the color colored to the UV bonding layer 220 and the UV coating layer 230 may be visible from the outside.

The color painting layer 215 may be formed of a material that is easy to adhere to the surface of the sensor part 210 (e.g., EMC Resin). The color painting layer 215 may be implemented with a material having a specified hardness or more.

The sensor 403 may include the sensor part 210, the color painting layer 215, the UV bonding layer 220, the deposition layer 225, and the UV coating layer 230. Unlike the sensor 130 of FIG. 2, the sensor 403 may further include the color painting layer 215 and the deposition layer 225. The configuration or function of the color painting layer 215 and the deposition layer 225 may be the same as the configuration or function of the color painting layer 215 and the deposition layer 225 of the sensor (401, 402).

The sensor 404 may include the sensor part 210, the color painting layer 215, the UV bonding layer 220, a printing layer 223, the deposition layer 225, and the UV coating layer 230. Unlike the sensor 403, the sensor 404 may further include the printing layer 223. The printing layer 223 may protect (protect the UV coating layer 230 when the deposition layer 225 is omitted) the deposition layer 225. The printing layer 223 may be a thin ink layer. The printing layer 223 may be maintained in a fully hardened state such that there is no change with time during the process or in storage, and may be formed using ink having a relatively high hardness. Furthermore, the printing layer 223 may be formed of a material that strengthens the adhesive force with the UV bonding layer 220. In an embodiment, the printing layer 223 may be colored with the predetermined pigment or the predetermined dye under design conditions.

According to various embodiments, at least one layer of the color painting layer 215, the printing layer 223, or the deposition layer 225 of the sensor 404 may be omitted.

Figure 4B:
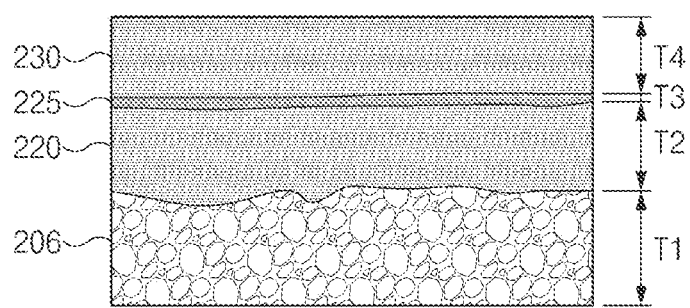

FIG. 4B is a view illustrating implementation of layers formed on a sensing chip, according to various embodiments of the disclosure. FIG. 4B is, but is not limited to, an example.

Referring to FIG. 4B, the packaging 206, the UV bonding layer 220, the deposition layer 225, and the UV coating layer 230 may be stacked sequentially on a sensing chip.

The packaging 206 may fix and protect the sensing chip. The packaging 206 may be implemented with EMC resin. In an embodiment, the thickness T1 of the packaging 206 may be formed to be about 60 µm to 70 µm.

The UV bonding layer 220 may be interposed between the UV coating layer 230 and the packaging 206. The UV bonding layer 220 may be formed of a material having high bonding force with each of the UV coating layer 230 and the packaging 206. The thickness T2 of the UV bonding layer 220 may be about 1 to 50 µm.

The deposition layer 225 may change the color, brightness, and the like that is visible from the outside. The deposition layer 225 may have a high reflectance and may be implemented with a single layer or multi-layer film to obtain a metallic color or a specific color. The thickness T3 of the deposition layer 225 may be relatively smaller than the thickness T2 of the UV bonding layer 220 or the thickness T4 of the UV coating layer 230.

The UV coating layer 230 is disposed on the top surface of the sensor 130 such that at least part of the UV coating layer 230 may be exposed to the outside through the housing 120. In the case of biometric sensor (e.g., fingerprint sensor), the UV coating layer 230 may be a portion that a part of the body of the user contacts. The thickness T4 of the UV coating layer 230 may be about 10 to 80 µm.

Figure 5:
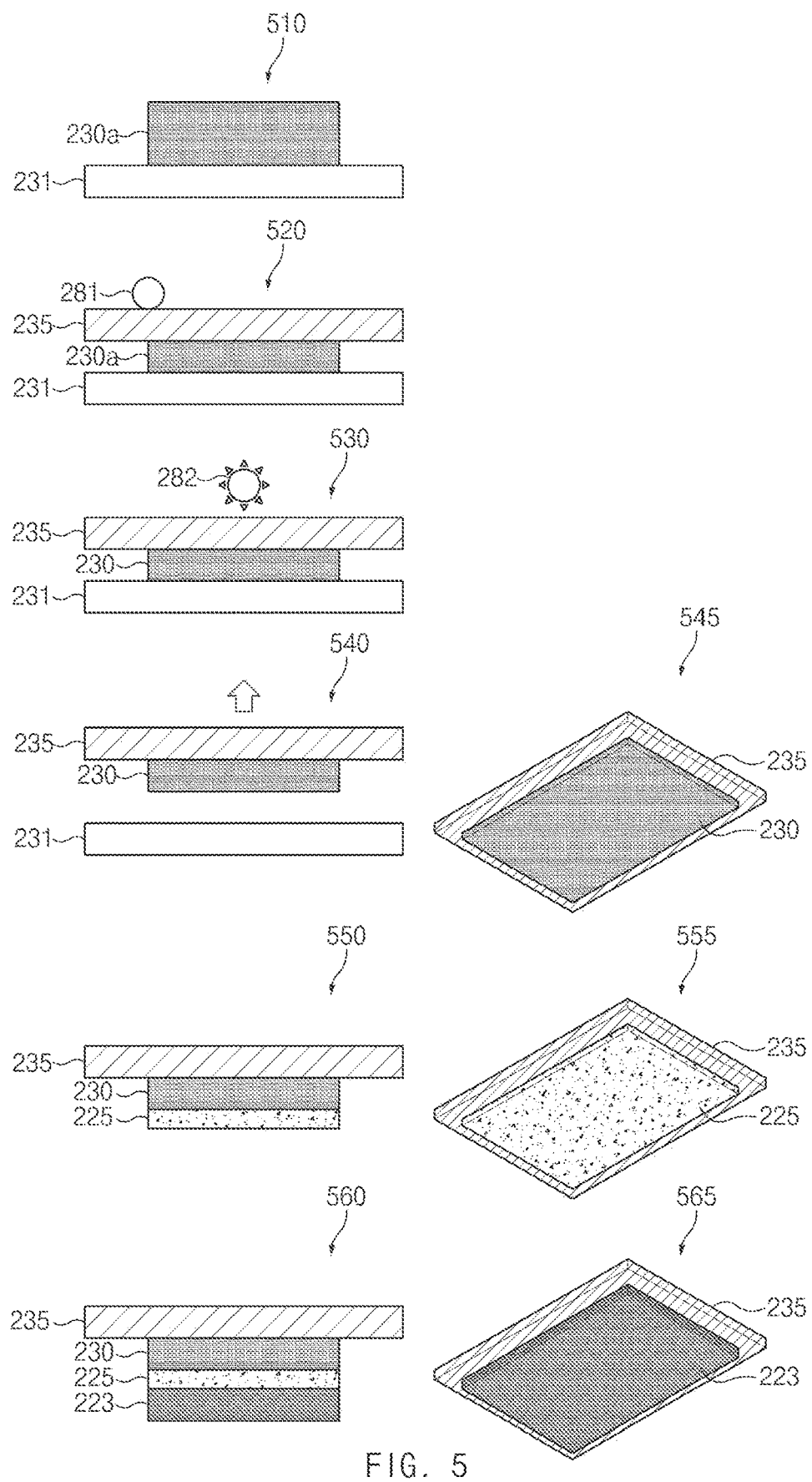
FIG. 5 illustrates a view of a process for forming a UV coating layer, a deposition layer, and a printing layer, according to various embodiments of the disclosure.

FIG. 5 illustrates a view of a process for forming a UV coating layer, a deposition layer, and a printing layer, according to various embodiments of the disclosure.

Referring to FIG. 5, in process 510, the UV resin (liquid state) 230a may be applied to the mold 231. The mold 231 may be a flat-type material such as metal, plastic film, or the like. The mold 231 may have a variety of surface patterns. According to an embodiment, the mold 231 may be treated (release coating treatment) as a thin film on the surface by vapor deposition, wet application, and the like.

The UV resin 230a may be in a liquid state and may be hardened when UV light is irradiated. The UV resin 230a may be discharged manually or automatically through a device. According to an embodiment, color pigment may be added to the UV resin 230a and the UV resin 230a may be stirred. The pigment of various colors may be added to the UV resin 230a under the design conditions.

In process 520, the release film 235 may be seated on the UV resin 230a. The release film 235 may be a transparent film such as PET. The release film 235 may be coated with a release material on one surface. The one surface coated with the release material may contact the UV resin 230a.

The other surface of the release film 235 (a surface on which the release material is not coated) may be pressed by the roller 281. The UV resin 230a between the release film 235 and the mold 231 may be spread and planarized by the forward movement of the roller 281.

In process 530, the UV light 282 may be irradiated to the UV resin 230a. For example, the UV resin 230a and the release film 235 seated on the mold 231 may be injected into an UV irradiator. When the UV light having the specified amount of light or more is irradiated to the UV resin 230a, the UV resin 230a may be hardened, and the UV coating layer 230 may be formed.

In process 540, the UV coating layer 230 may be detached from the mold 231 while being coupled to the release film 235, and then a UV transfer film 545 may be formed. When the release force of the release film 235 is greater than the release force of the surface of the mold 231, the UV coating layer 230 may be easily separated from the mold 231.

According to various embodiments, the release film 235, to which the UV coating layer 230 is coupled, may be cut to be in a specified arrangement and size, depending on the manufacturing environment.

According to various embodiments, in process 550, depending on color specifications and requirements, a UV transfer film 555 may be formed by adding the deposition layer 225 to the UV coating layer 230. The deposition layer 225 may be added to a surface opposite to the surface to which the release film 235 is attached. The deposition layer 225 may be formed by a deposition process such as E-beam, or the like. According to an embodiment, the deposition layer 225 may be omitted.

According to various embodiments, in process 560, a UV transfer film 565 may be formed by adding the printing layer 223 capable of protecting (protecting the UV coating layer 230 when the deposition layer 225 is omitted) the deposition layer 225. The printing layer 223 may be added to a surface opposite to the surface to which the release film 235 is attached.

The printing layer 223 may be added to prevent damage due to direct exposure and contact of the deposition layer 225 in handling. The printing layer 223 may be a thin ink layer. The printing layer 223 may be maintained in a fully hardened state such that there is no change with time during the process or in storage, and may be formed using ink having a relatively high hardness. The printing layer 223 may be added if necessary, depending on the process and color; and the printing layer 223 may be omitted if there is no problem in handling.

Figure 6:
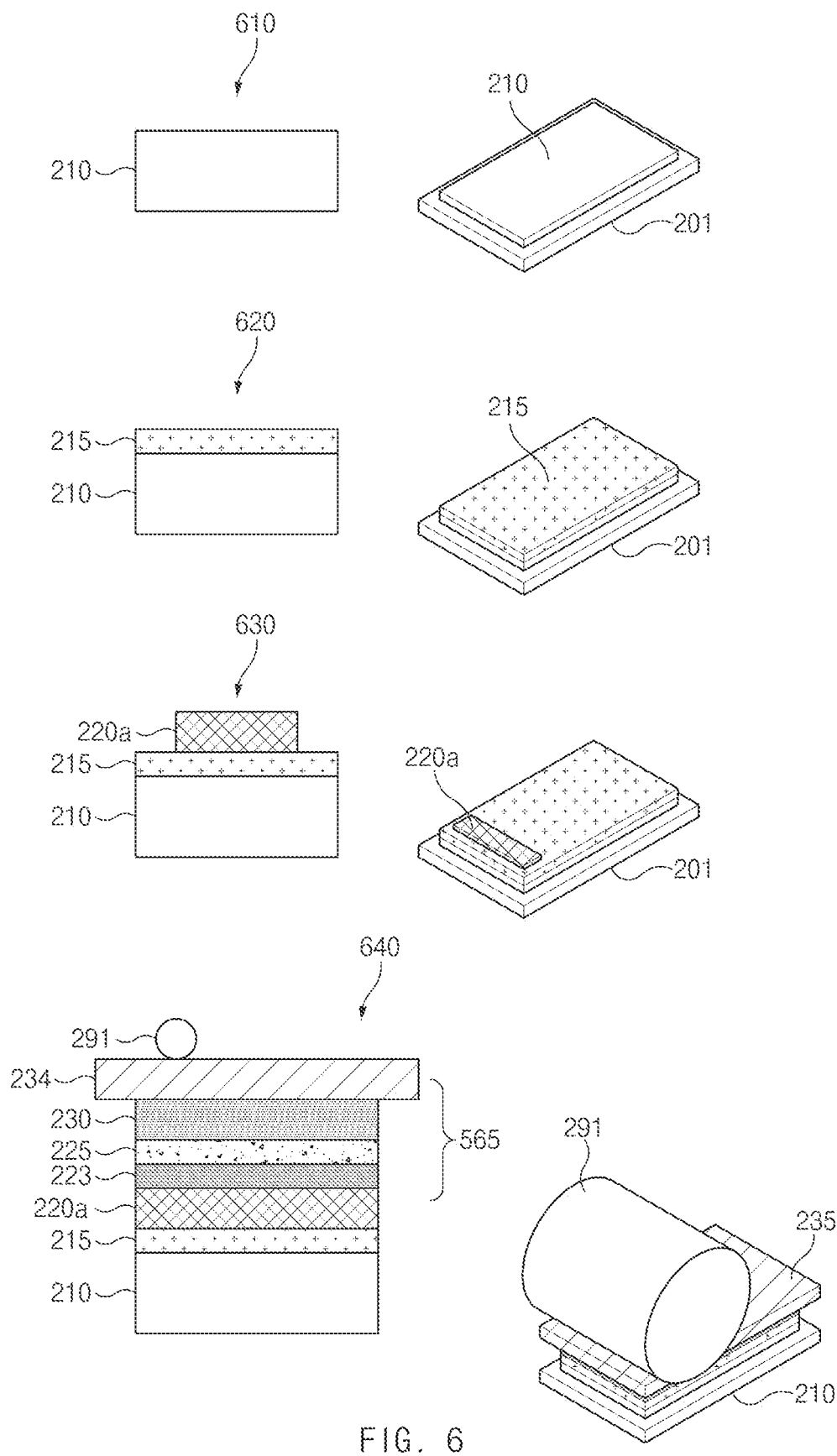
FIG. 6 illustrates a view of a process for forming a UV bonding layer and a color painting layer of a fingerprint sensor of a sensor, according to various embodiments of the disclosure.

FIG. 6 illustrates a view of a process for forming a UV bonding layer and a color painting layer of a fingerprint sensor of a sensor, according to various embodiments of the disclosure.

Referring to FIG. 6, in process 610, the sensor part 210 may be provided. The sensor part 210 may be in the form in which a sensing chip and packaging are seated on the substrate 201.

According to various embodiments, in process 620, the color painting layer 215 may be formed on one surface of the sensor part 210. The color painting layer 215 may be used when it is necessary to implement various colors including white color or deep color, which it is difficult to implement, in a level of coloring the deposition layer 225 and the UV coating layer 230. In an embodiment, the color painting layer 215 may be omitted.

In process 630, the UV bond liquid 220a may be applied to the color painting layer 215 (on one surface of the sensor part 210 when the color painting layer 215 is not present). The UV bond liquid 220a may be discharged manually or automatically through a device.

In process 640, the UV transfer film 545, 555, or 565 of FIG. 5 may be seated on the UV bond liquid 220a (on a surface opposite to a surface facing the sensor part 210). An embodiment is exemplified in FIG. 6 as the UV transfer film 565 includes the deposition layer 225 and printing layer 223. However, an embodiment is not limited thereto. For example, the deposition layer 225 or printing layer 223 may be omitted.

The uncoated surface of the release film 235 may be pressed by the roller 291. The UV bond liquid 220a may be spread and planarized by the forward movement of the roller 291.

Figure 7:
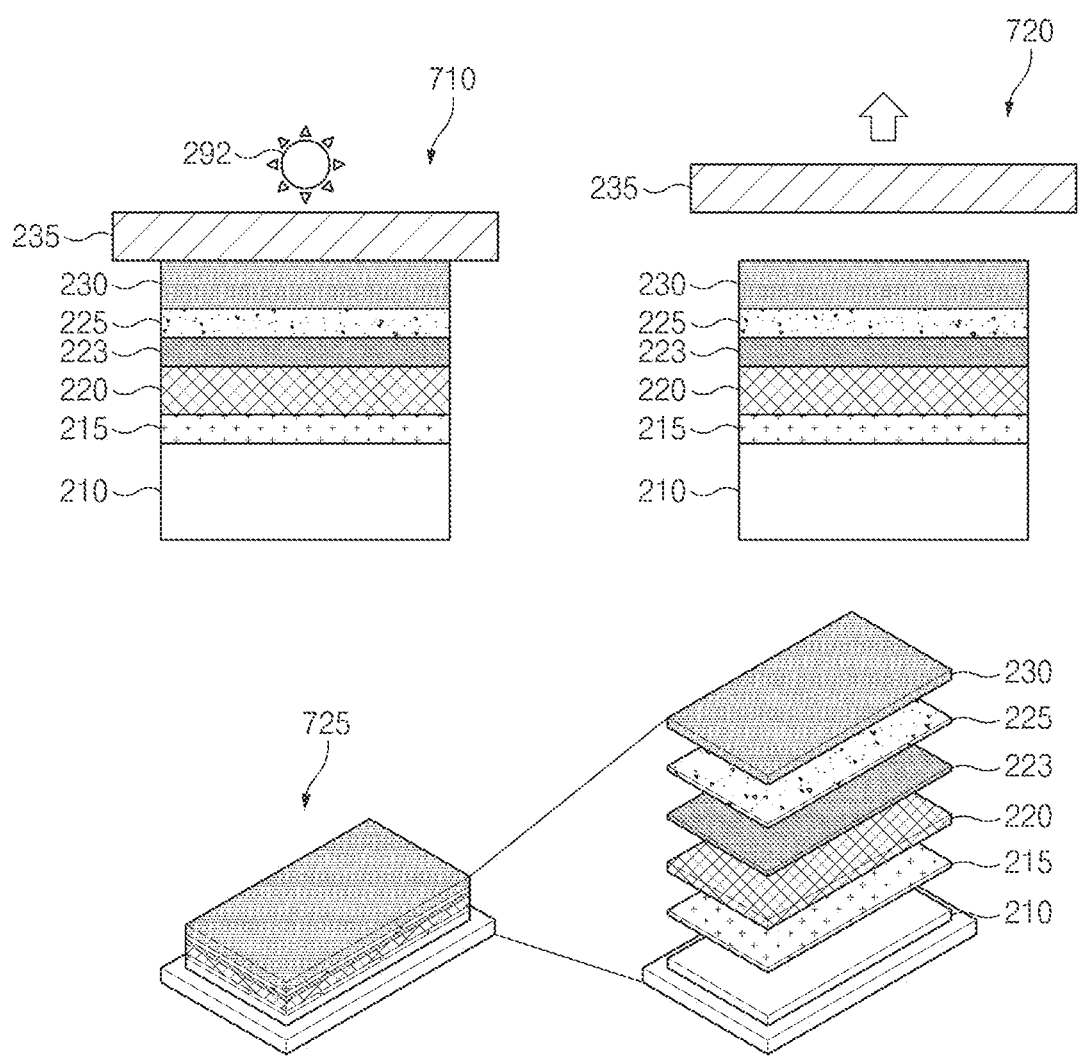
FIG. 7 is a view illustrating hardening of a UV coating layer and removal of a release film, according to various embodiments of the disclosure.

FIG. 7 is a view illustrating hardening of a UV coating layer and removal of a release film, according to various embodiments of the disclosure.

Referring to FIG. 7, in process 710, the UV light 292 may be irradiated to the UV bond liquid 220a. The UV light 292 may pass through the release film 235, the UV coating layer 230, the deposition layer 225, or printing layer 223 to reach the UV bond liquid 220a. When the specified amount of UV light is irradiated to the UV bond liquid 220a, the UV bond liquid 220a may be hardened and then the UV bonding layer 220 may be formed.

In process 720, the release film 235 may be removed. A sensor 725 may include the UV coating layer 230, the deposition layer 225, printing layer 223, the UV bonding layer 220, the color painting layer 215, and the sensor part 210.

A sensor coating method according to various embodiments may include applying UV resin (e.g., the UV resin 230a of FIG. 3) to a mold (e.g., the mold 231 of FIG. 3), seating a release film (e.g., the release film 235 of FIG. 3) on the UV resin, planarizing the UV resin, forming a UV coating layer (e.g., the UV coating layer 230 of FIG. 3) by irradiating UV light to the UV resin so as to pass through the release film, separating the release film, to which the UV coating layer is coupled, from the mold, applying a UV bond liquid (the UV bond liquid 220a of FIG. 3) on the sensing surface of a sensor, seating a release film, to which the UV coating layer is coupled, on the UV bond liquid such that the UV coating layer contacts the UV bond liquid, planarizing the UV bond liquid, and forming the UV bonding layer (the UV bonding layer 220 of FIG. 3) by irradiating UV light to the UV resin so as to pass through the release film and the UV coating layer.

Figure 8:
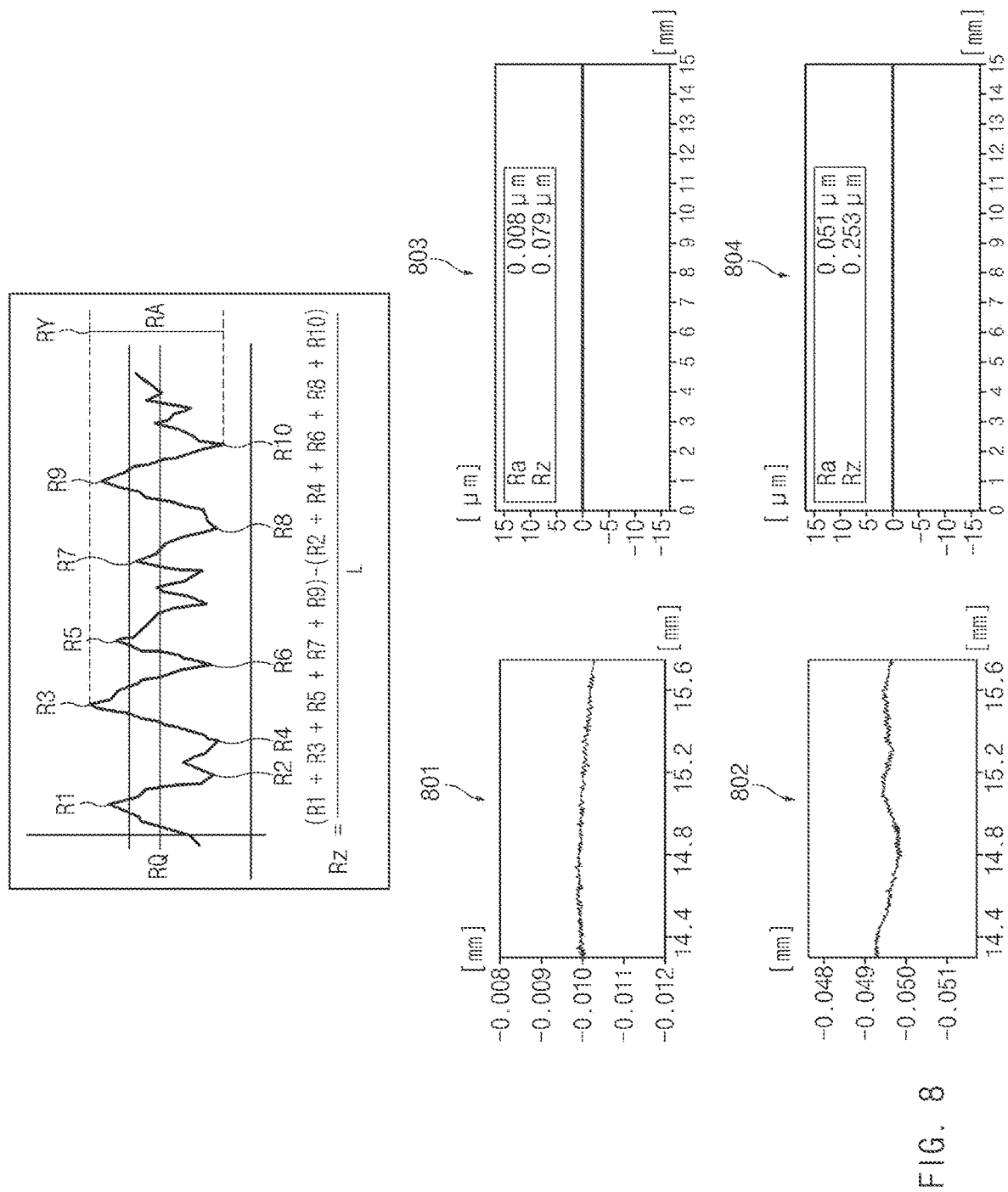
FIG. 8 illustrates contour and roughness on a surface of a UV coating layer, according to various embodiments of the disclosure.

FIG. 8 illustrates contour and roughness on a surface of a UV coating layer, according to various embodiments of the disclosure.

Referring to FIG. 8, a first graph 801 represents the surface contour of a fingerprint sensor according to one embodiment of the disclosure. A second graph 802 illustrates the surface contour of the fingerprint sensor formed through the heat-transfer process according to the comparative example.

In the first graph 801, the contour of the fingerprint sensor according to an embodiment of the disclosure may have the relatively high flatness in the form of a gentle curve or a similar straight line.

In the second graph 802, the vertical height of the fingerprint sensor according to the heat-transfer process is significantly changed and the flatness of the fingerprint sensor according to the heat-transfer process may be relatively low.

The first roughness graph 803 represents the surface roughness of a fingerprint sensor according to one embodiment of the disclosure. The second roughness graph 804 illustrates the surface roughness of the fingerprint sensor formed through the heat-transfer process.

The surface roughness may be calculated as arithmetical mean roughness Ra or ten-point mean roughness Rz. The arithmetical mean roughness Ra may be a value from integrating an area in an average irregularity graph when the surface is relatively flat and has a specific shape of curvature. The ten-point mean roughness Rz may be the average of the height difference between the first to fifth highest points of the highest parts and the first to fifth lowest points of the lowest parts in the measurement section, when there is irregular bending on the surface. Generally, the ten-point mean roughness Rz may be measured to be greater than the arithmetical mean roughness Ra.

For example, in the specified measurement section, the inflection points of height R1, R3, R5, R7, and R9 may be the highest; when the inflection points of height R2, R4, R6, R8, and R10 are the lowest, the ten-point mean roughness Rz may be calculated by the following Equation 1.

$$Rz = \frac{(R1 + R3 + R5 + R7 + R9) - (R2 + R4 + R6 + R8 + R10)}{L} \quad \text{Equation 1}$$

In the first roughness graph 803 and the second roughness graph 804, the surface roughness (Ra=0.008 μm and Rz=0.079 μm) of the fingerprint sensor according to an embodiment of the disclosure may be lower than the surface roughness (Ra=0.051 μm and Rz=0.253 μm) of the fingerprint sensor according to the heat-transfer process.

The ten-point mean roughness Rz of the fingerprint sensor according to an embodiment of the disclosure may not be less than 0 μm and may not be greater than 0.20 μm.

The production cost of the fingerprint sensor according to an embodiment of the disclosure may be less than that of the fingerprint sensor according to the heat-transfer process due to the simple structure and process. The sensing surface (coating surface) of the fingerprint sensor according to an embodiment of the disclosure may have high flatness; defects (pinholes, protrusions, cracks, and the like) in appearance may occur slightly, and thus the yield of products may be improved.

Figure 9:
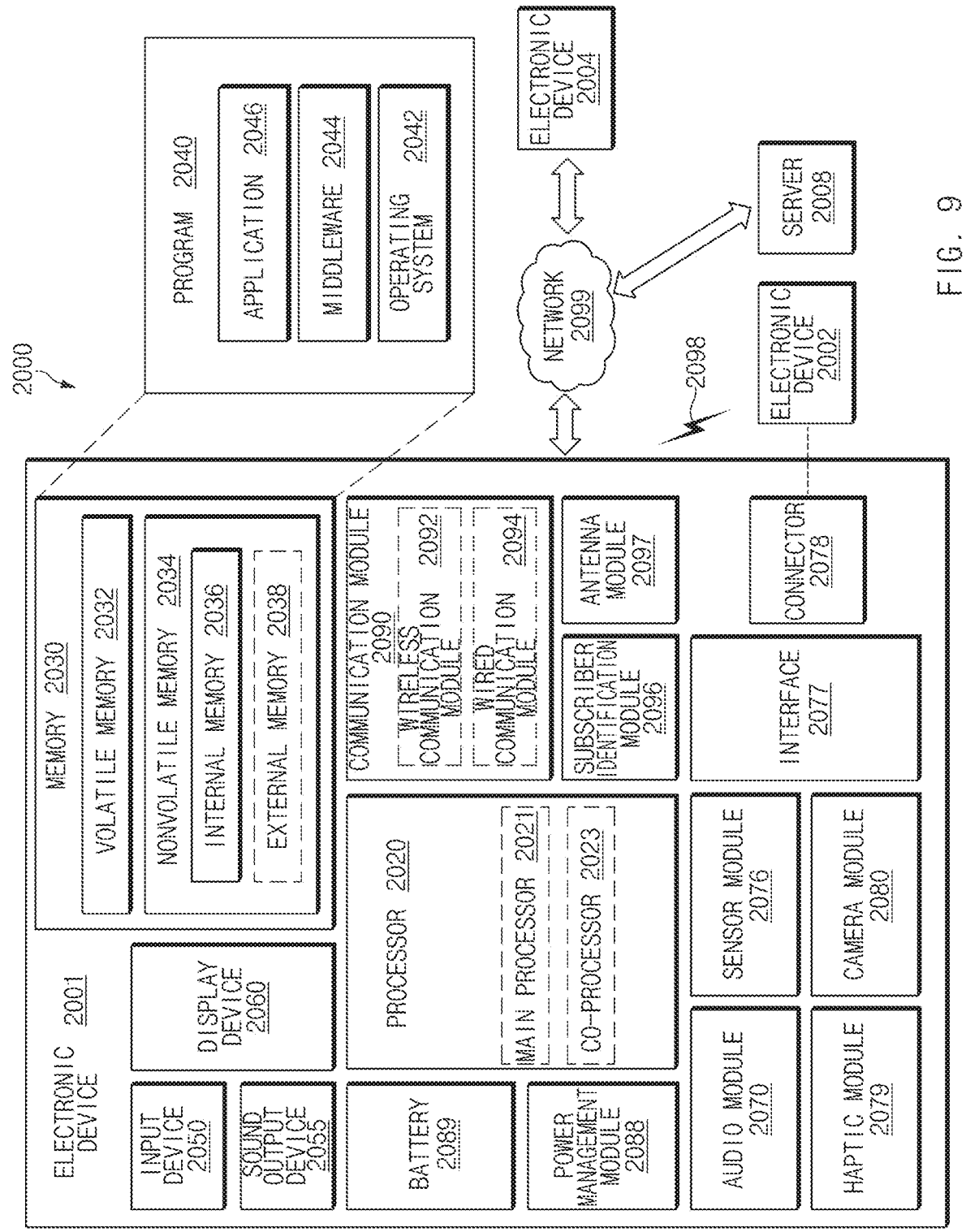
FIG. 9 is a block diagram of an electronic device in a network environment, according to various embodiments of the disclosure.

FIG. 9 illustrates a block diagram of an electronic device in a network environment, according to various embodiments of the disclosure.

Referring to FIG. 9, under a network environment 2000, an electronic device 2001 (e.g., the electronic device 101) may communicate with an electronic device 2002 through local first network 2098 or may communication with an electronic device 2004 or a server 2008 through a second network 2099. According to an embodiment, the electronic device 2001 may communicate with the electronic device 2004 through the server 2008.

According to an embodiment, the electronic device 2001 may include a processor 2020, a memory 2030, an input device 2050 (e.g., a micro-phone or a mouse), a sound output device 2055, a display device 2060, an audio module 2070, a sensor module 2076, an interface 2077, a haptic module 2079, a camera module 2080, a power management module 2088, a battery 2089, a communication module 2090, a subscriber identification module 2096 and an antenna module 2097. According to an embodiment, the electronic device 2001 may not include at least one (e.g., the display device 2060 or the camera module 2080) of the above-described elements or may further include other element(s).

The processor 2020 may include one or more of a CPU, an AP, a graphic processing unit (GPU), an image signal processor (ISP) of a camera or a communication processor (CP). According to an embodiment, the processor 2020 may be implemented with a system on chip (SoC) or a system in package (SiP). For example, the processor 2020 may drive an operating system (OS) or an application to control at least one of another element (e.g., hardware or software element)

connected to the processor 2020 and may process and compute various data. The processor 2020 may load a command or data, which is received from at least one of other elements (e.g., the communication module 2090), into a volatile memory 2032 to process the command or data and may store the result data into a nonvolatile memory 2034. The processor 2020 may include a main processor 2021 and a co-processor 2023.

The memory 2030 may include, for example, the volatile memory 2032 or the nonvolatile memory 2034. The volatile memory 2032 may include, for example, a random access memory (RAM) (e.g., a dynamic RAM (DRAM), a static RAM (SRAM), or a synchronous DRAM (SDRAM)). The nonvolatile memory 2034 may include, for example, a one time programmable read-only memory (OTPROM), a programmable read-only memory (PROM), an erasable PROM (EPROM), an electrically EPROM (EEPROM), a mask ROM, a flash ROM, a flash memory, a hard disk drive (HDD), or a solid-state drive (SSD). In addition, the nonvolatile memory 2034 may be configured in the form of an internal memory 2036 or the form of an external memory 2038 which is available through connection only if necessary, according to the connection with the electronic device 2001. The external memory 2038 may further include a flash drive such as compact flash (CF), secure digital (SD), micro-SD, mini-SD, extreme digital (xD), a multimedia card (MMC), or a memory stick. The external memory 2038 may be operatively or physically connected with the electronic device 2001 in a wired manner (e.g., a cable or a universal serial bus (USB)) or a wireless (e.g., Bluetooth) manner.

For example, the memory 2030 may store, for example, at least one different software element, such as a command or data associated with the program 2040, of the electronic device 2001. The program 2040 may include, for example, a OS 2042, a middleware 2044, and an application 2046.

The input device 2050 may include a microphone, a mouse, or a keyboard. According to an embodiment, the keyboard may include a keyboard physically connected or a virtual keyboard displayed through the display device 2060.

The display device 2060 may include a display, a hologram device or a projector, and a control circuit to control a relevant device. The display may include, for example, a liquid crystal display (LCD), a light emitting diode (LED) display, an organic LED (OLED) display, a microelectromechanical systems (MEMS) display, or an electronic paper display. According to an embodiment, the display may be flexibly, transparently, or wearably implemented. The display may include a touch circuitry, which is able to detect a user's input such as a gesture input, a proximity input, or a hovering input or a pressure sensor (interchangeably, a force sensor) which is able to measure the intensity of the pressure by the touch. The touch circuit or the pressure sensor may be implemented integrally with the display or may be implemented with at least one sensor separately from the display. The hologram device may show a stereoscopic image in a space using interference of light. The projector may project light onto a screen to display an image. The screen may be located inside or outside the electronic device 2001.

The audio module 2070 may convert, for example, from a sound into an electrical signal or from an electrical signal into the sound. According to an embodiment, the audio module 2070 may acquire sound through the input device 2050 (e.g., a microphone) or may output sound through an output device (not illustrated) (e.g., a speaker or a receiver) included in the electronic device 2001, an external electronic device (e.g., the electronic device 2002 (e.g., a wireless speaker or a wireless headphone)) or an electronic device 2006 (e.g., a wired speaker or a wired headphone) connected with the electronic device 2001

The sensor module 2076 may measure or detect, for example, an internal operating state (e.g., power or temperature) of the electronic device 2001 or an external environment state (e.g., an altitude, a humidity, or brightness) to generate an electrical signal or a data value corresponding to the information of the measured state or the detected state. The sensor module 2076 may include, for example, at least one of a gesture sensor, a gyro sensor, a barometric pressure sensor, a magnetic sensor, an acceleration sensor, a grip sensor, a proximity sensor, a color sensor (e.g., a red, green, blue (RGB) sensor), an infrared sensor, a biometric sensor (e.g., an iris sensor, a fingerprint senor, a heartbeat rate monitoring (HRM) sensor, an e-nose sensor, an electromyography (EMG) sensor, an electroencephalogram (EEG) sensor, an electrocardiogram (ECG) sensor), a temperature sensor, a humidity sensor, an illuminance sensor, or an UV sensor. The sensor module 2076 may further include a control circuit for controlling at least one or more sensors included therein. According to an embodiment, the sensor module 2076 may be controlled by using the processor 2020 or a processor (e.g., a sensor hub) separate from the processor 2020. In the case that the separate processor (e.g., a sensor hub) is used, while the processor 2020 is in a sleep state, the separate processor may operate without awakening the processor 2020 to control at least a portion of the operation or the state of the sensor module 2076.

According to an embodiment, the interface 2077 may include a high definition multimedia interface (HDMI), a USB, an optical interface, a recommended standard 232 (RS-232), a D-subminiature (D-sub), a mobile high-definition link (MHL) interface, a SD card/MMC interface, or an audio interface. A connector 2078 may physically connect the electronic device 2001 and the electronic device 2006. According to an embodiment, the connector 2078 may include, for example, an USB connector, an SD card/MMC connector, or an audio connector (e.g., a headphone connector).

The haptic module 2079 may convert an electrical signal into mechanical stimulation (e.g., vibration or motion) or into electrical stimulation. For example, the haptic module 2079 may apply tactile or kinesthetic stimulation to a user. The haptic module 2079 may include, for example, a motor, a piezoelectric element, or an electric stimulator.

The camera module 2080 may capture, for example, a still image and a moving picture. According to an embodiment, the camera module 2080 may include at least one lens (e.g., a wide-angle lens and a telephoto lens, or a front lens and a rear lens), an image sensor, an ISP, or a flash (e.g., a LED or a xenon lamp).

The power management module 2088, which is to manage the power of the electronic device 2001, may constitute at least a portion of a power management integrated circuit (PMIC).

The battery 2089 may include a primary cell, a secondary cell, or a fuel cell and may be recharged by an external power source to supply power at least one element of the electronic device 2001.

The communication module 2090 may establish a communication channel between the electronic device 2001 and an external device (e.g., the first external electronic device 2002, the second external electronic device 2004, or the server 2008). The communication module 2090 may support wired communication or wireless communication through the established communication channel. According to an embodiment, the communication module 2090 may include a wireless communication module 2092 or a wired communication module 2094. The communication module 2090 may communicate with the external device (e.g., the first external electronic device 2002, the second external electronic device 2004, or the server 2008) through a first network 2098 (e.g. a wireless local area network (LAN) such as Bluetooth or infrared data association (IrDA)) or the second network 2099 (e.g., a wireless wide area network such as a cellular network) through a relevant module among the wireless communication module 2092 or the wired communication module 2094.

The wireless communication module 2092 may support, for example, cellular communication, local wireless communication, global navigation satellite system (GNSS) communication. The cellular communication may include, for example, long-term evolution (LTE), LTE-advance (LTE-A), code division multiple access (CMA), wideband CDMA (WCDMA), universal mobile telecommunications system (UMTS), wireless broadband (WiBro), or global system for mobile communications (GSM). The local wireless communication may include wireless fidelity (Wi-Fi), Wi-Fi direct, light fidelity (Li-Fi), Bluetooth, Bluetooth low energy (BLE), Zigbee, near field communication (NFC), magnetic secure transmission (MST), radio frequency (RF), or a body area network (BAN). The GNSS may include at least one of a global positioning system (GPS), a global navigation satellite system (Glonass), Beidou Navigation Satellite System (Beidou), the European global satellite-based navigation system (Galileo), or the like. In the disclosure, "GPS" and "GNSS" may be interchangeably used.

According to an embodiment, when the wireless communication module 2092 supports cellar communication, the wireless communication module 2092 may, for example, identify or authenticate the electronic device 2001 within a communication network using the subscriber identification module (e.g., a subscriber identification module (SIM) card) 2096. According to an embodiment, the wireless communication module 2092 may include a CP separate from the processor 2020 (e.g., an AP). In this case, the CP may perform at least a portion of functions associated with at least one of elements 2020 to 2096 of the electronic device 2001 in substitute for the processor 2020 when the processor 2020 is in an inactive (sleep) state, and together with the processor 2020 when the processor 2020 is in an active state. According to an embodiment, the wireless communication module 2092 may include a plurality of communication modules, each supporting only a relevant communication scheme among cellular communication, local wireless communication, or a GNSS communication.

The wired communication module 2094 may include, for example, include a LAN service, a power line communication, or a plain old telephone service (POTS).

For example, the first network 2098 may employ, for example, WiFi direct or Bluetooth for transmitting or receiving commands or data through wireless direct connection between the electronic device 2001 and the first external electronic device 2002. The second network 2099 may include a telecommunication network (e.g., a computer network such as a LAN or a wide area network (WAN), the Internet or a telephone network) for transmitting or receiving commands or data between the electronic device 2001 and the second electronic device 2004.

According to various embodiments, the commands or the data may be transmitted or received between the electronic device 2001 and the second external electronic device 2004 through the server 2008 connected with the second network 2099. Each of the first and second external electronic devices 2002 and 2004 may be a device of which the type is different from or the same as that of the electronic device 2001. According to various embodiments, all or a part of operations that the electronic device 2001 will perform may be executed by another or a plurality of electronic devices (e.g., the electronic devices 2002 and 2004 or the server 2008). According to an embodiment, in the case that the electronic device 2001 executes any function or service automatically or in response to a request, the electronic device 2001 may not perform the function or the service internally, but may alternatively or additionally transmit requests for at least a part of a function associated with the electronic device 2001 to any other device (e.g., the electronic device 2002 or 2004 or the server 2008). The other electronic device (e.g., the electronic device 2002 or 2004 or the server 2008) may execute the requested function or additional function and may transmit the execution result to the electronic device 2001. The electronic device 2001 may provide the requested function or service using the received result or may additionally process the received result to provide the requested function or service. To this end, for example, cloud computing, distributed computing, or client-server computing may be used.

Figure 10:
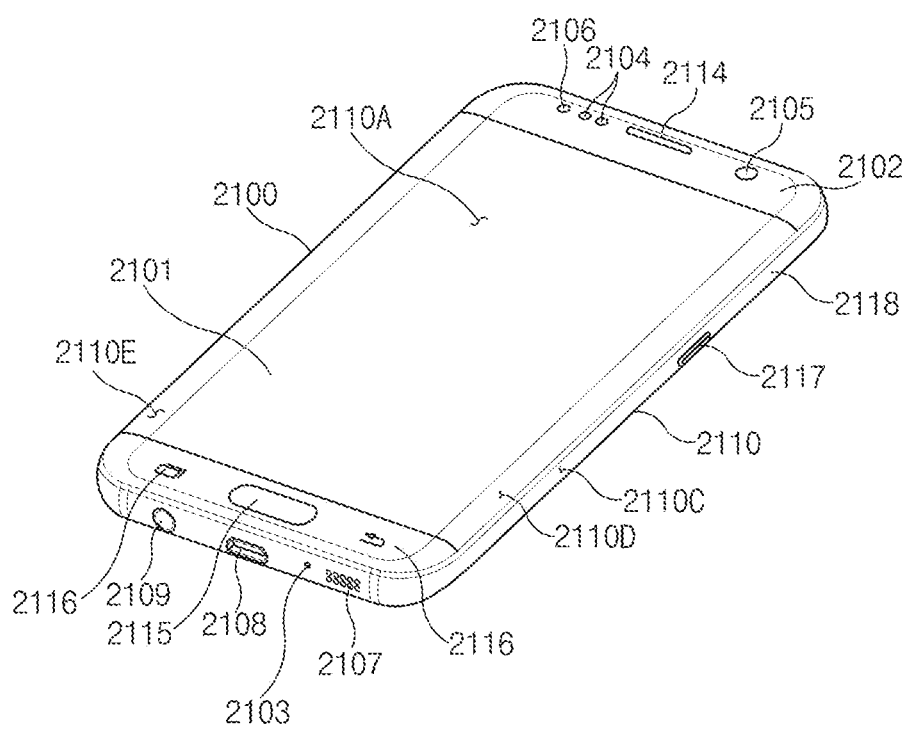
FIG. 10 is a front perspective view of an electronic device according to an embodiment of the disclosure.

FIG. 10 is a front perspective view of an electronic device according to an embodiment of the disclosure.

Figure 11:
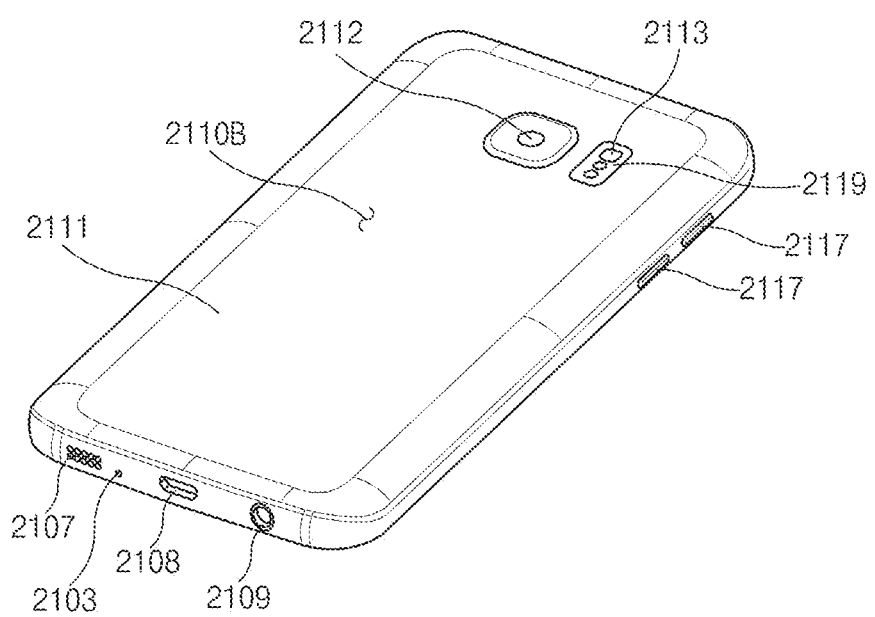
FIG. 11 is a rear perspective view of an electronic device of FIG. 10 of the disclosure.

FIG. 11 is a rear perspective view of an electronic device of FIG. 10 of the disclosure.

Referring to FIGS. 10 and 11, an electronic device 2100 according to an embodiment may include a housing 2110 including a first surface (or a front surface) 2110A, a second surface (or a rear surface) 2110B, and a side surface 2110C surrounding a space between the first surface 2110A and the second surface 2110B. In another embodiment (not illustrated), a housing may refer to a structure which forms a part of the first surface 2110A, the second surface 2110B, and side surfaces 2110C of FIG. 10. According to an embodiment, the first surface 2110A may be formed by a front plate 2102 (e.g., a glass plate including various coating layers, or a polymer plate), at least a portion of which is substantially transparent. The second surface 2110B may be formed by a rear plate 2111 which is substantially opaque. For example, the rear plate 2111 may be formed by coated or colored glass, ceramic, polymer, metal (e.g., aluminum, stainless steel (STS), or magnesium), or a combination of at least two of the materials. The side surface 2110C may be coupled with the front plate 2102 and the rear plate 2111, and may be formed by a side bezel structure (or a "side member") 2118 including metal and/or polymer. In any embodiment, the rear plate 2111 and the side bezel structure 2118 may be integrally formed and may include the same material (e.g., a metal material such as aluminum).

In the illustrated embodiment, the front plate 2102 may include a first region 2110D, which is bent toward the rear plate 2111 from the first surface 2110A so as to be seamlessly extended, in each of opposite long edges of the front plate 2102. In the illustrated embodiment (refer to FIG. 11), the rear plate 2111 may include a second region 2110E, which is bent toward the front plate 2102 from the second surface 2110B so as to be seamlessly extended, in each of the opposite long edges. In any embodiment, the front plate 2102 or the rear plate 2111 may include only one of the first region 2110D or the second region 2110E. In the embodiments, when viewed from a side surface of the electronic device 2100, a side bezel structure may have a first thickness (or width) at a side surface where the first region 2110D or the second region 2110E is not included, and may has a second thickness smaller than the first thickness at a side surface including the first region 2110D or the second region 2110E.

According to an embodiment, the electronic device 2100 may include at least one or more of a display 2101, audio modules 2103, 2107, and 2114, sensor modules 2104 and 2119, camera modules 2105, 2112, and 2113, key input devices 2115, 2116, and 2117, an indicator 2106, and connector holes 2108 and 2109. In any embodiment, the electronic device 2100 may not include at least one (e.g., the key input device (2115, 2116, 2117) or the indicator 2106) of the components or may further include any other component.

The display 2101 may be exposed through a considerable portion of the front plate 2102, for example. In any embodiment, at least a part of the display 2101 may be exposed through the first surface 2110A and the front plate 2102 forming the first region 2110D of the side surface 2110C. The display 2101 may be coupled with a touch sensing circuit, a pressure sensor which may measure the intensity (or pressure) of a touch, and/or a digitizer detecting a magnetic stylus pen or may be positioned adjacent thereto. In any embodiment, at least a part of the sensor module (2104, 2119) and/or at least a part of the key input device (2115, 2116, 2117) may be disposed in the first region 2110D and/or the second region 2110E.

The audio module (2103, 2107, 2114) may include a microphone hole 2103 and a speaker hole (2107, 2114). A microphone for obtaining external sound may be disposed inside the microphone hole 2103; in any embodiment, a plurality of microphones may be disposed inside the microphone hole 103. The speaker hole (2107, 2114) may include the external speaker hole 2107 and the receiver hole 2114 for call. In any embodiment, the speaker hole (2107, 2114) and the microphone hole 2103 may be implemented with one hole, or a speaker (e.g., a piezo speaker) may be included without the speaker hole (2107, 2114).

The sensor module (2104, 2119) may generate an electrical signal or a data value corresponding to an internal operation state of the electronic device 2100 or corresponding to an external environment state. The sensor module (2104, 2119) may include, for example, the first sensor module 2104 (e.g., a proximity sensor) and/or a second sensor module (not illustrated) (e.g., a fingerprint sensor) positioned on the first surface 2110A of the housing 2110, and/or the third sensor module 2119 (e.g., a hear rate monitor (HRM) sensor) positioned on the second surface 2110B of the housing 2110. The fingerprint sensor may be positioned on the second surface 2110B as well as the first surface 2110A (e.g., a home key button 2115) of the housing 2110. The electronic device 2100 may further include a sensor module not illustrated, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor 2104.

The camera module (2105, 2112, 2113) may include the first camera device 2105 positioned on the first surface 2110A of the electronic device 2100, and the second camera module 2112 and/or the flash 2113 positioned on the second surface 2110B. The camera modules 2105 and 2112 may include one or plural lenses, an image sensor, and/or an ISP. The flash 2113 may include, for example, a LED or a xenon lamp. In any embodiment, two or more lenses (wide-angle and telephoto lens) and image sensors may be disposed on one surface of the electronic device 2100.

The key input device (2115, 2116, 2117) may include the home key button 2115 positioned on the first surface 2110A of the housing 2110, a touch pad 2116 positioned in the vicinity of the home key button 2115, and/or a side key button 2117 positioned on the side surface 2110C of the housing 2110. In another embodiment, the electronic device 2100 may not include all or a part of the aforementioned key input devices 2115, 2116, and 2117, and the key input device 2115, 2116, and 2117 not included may be implemented in the form of a soft key on the display 2101.

The indicator 2106 may be positioned, for example, on the first surface 2110A of the housing 2110. The indicator 2106 may provide state information of the electronic device 2100, for example, in the form of light, and may include an LED.

The connector holes (2108, 2109) may include the first connector hole 2108 which may accommodate a connector (e.g., a USB connector) for transmitting/receiving a power and/or data to/from an external electronic device, and/or the second connector hole (or an earphone jack) 2109 which may accommodate for transmitting/receiving an audio signal to/from the external electronic device.

Figure 12:
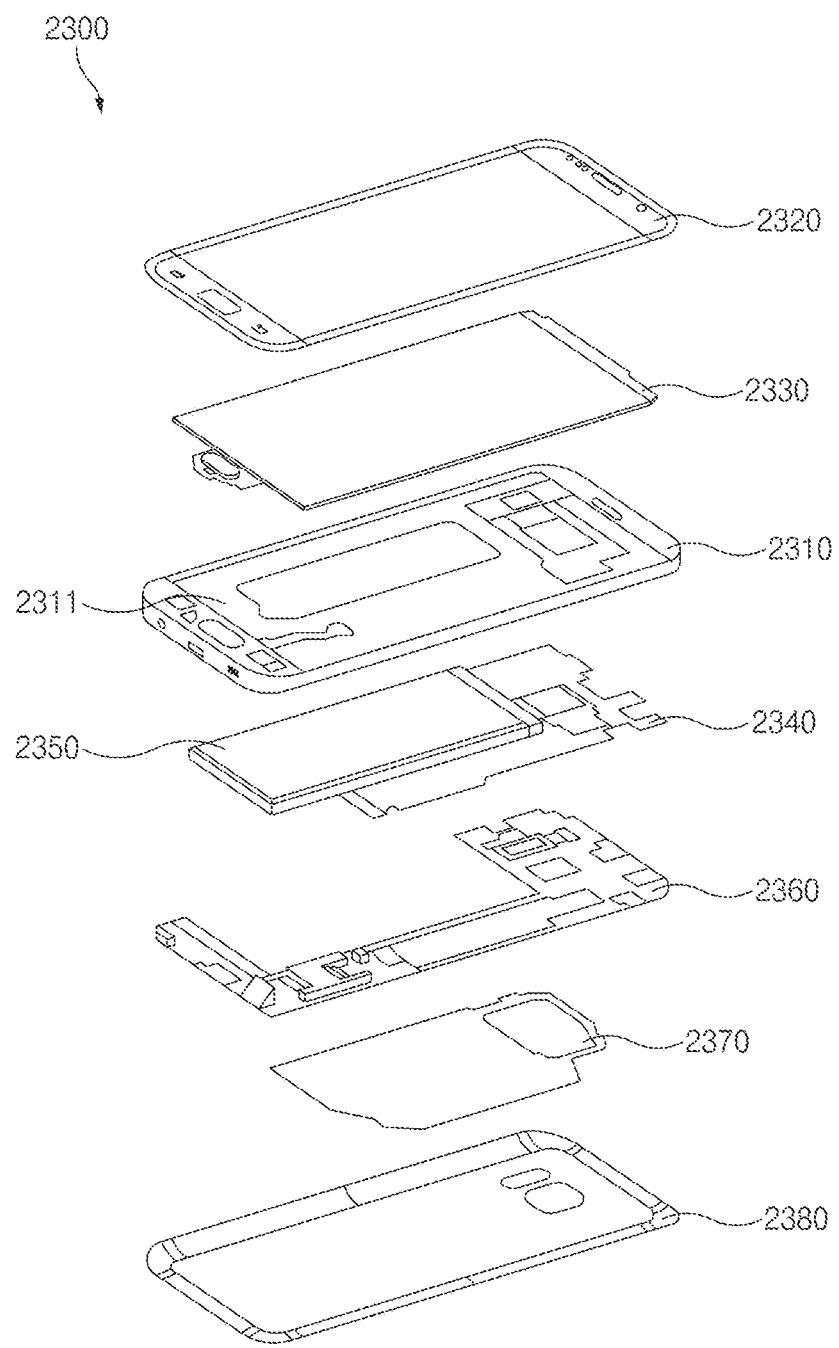
FIG. 12 is an exploded perspective view of an electronic device of FIG. 10 of the disclosure.

FIG. 12 is an exploded perspective view of an electronic device of FIG. 10 of the disclosure.

Referring to FIG. 12, an electronic device 2300 may include a side bezel structure 2310, a first support member 2311 (e.g., a bracket), a front plate 2320, a display 2330, a printed circuit board 2340, a battery 2350, a second support member 2360 (e.g., a rear case), an antenna 2370, and a rear plate 2380. In any embodiment, the electronic device 2300 may not include at least one (e.g., the first support member 2311 or the second support member 2360) of the components or may further include any other component. At least one of the components of the electronic device 2300 may be identical or similar to at least one of the components of the electronic device 2100 of FIG. 10 or 12, and thus, additional description will be omitted to avoid redundancy.

The first support member 2311 may disposed inside the electronic device 2300, and may be connected with the side bezel structure 2310 or may be integrally formed with the side bezel structure 2310. The first support member 2311 may be formed of, for example, a metal material and/or a nonmetal material (e.g., polymer). The display 2330 may be coupled with one surface of the first support member 2311, and the printed circuit board 2340 may be coupled with an opposite surface of the first support member 2311. A processor, a memory, and/or an interface may be mounted on the printed circuit board 2340. For example, the processor may include one or more of a CPU, an AP, a graphic processing device, an ISP, a sensor hub processor, or a communication processor.

The memory may include, for example, a volatile memory or a nonvolatile memory.

The interface may include, for example, a HDMI, a USB interface, a SD card interface, and/or an audio interface. The interface may electrically or physically connect, for example, the electronic device 2300 with an external electronic device and may include a USB connector, an SD card/MMC connector, or an audio connector.

The battery 2350 which is a device for supplying a power to at least one component of the electronic device 2300 may include, for example, a primary cell incapable of being recharged, a secondary cell rechargeable, or a fuel cell. At least a part of the battery 2350 may be disposed on substantially the same plane as the printed circuit board 2340, for example. The battery 2350 may be integrally positioned within the electronic device 2100, or may be positioned to be removable from the electronic device 2100.

The antenna 2370 may be interposed between the rear plate 2380 and the battery 2350. The antenna 2370 may include, for example, a NFC antenna, an antenna for wireless charging, and/or a MST antenna. For example, the antenna 2370 may perform short range communication with an external device or may wirelessly transmit/receive a power needed for charging. In another embodiment, an antenna structure may be formed by a part of the side bezel structure 2310 and/or the first support member 2311, or by a combination thereof.

According to various embodiments, an electronic device (e.g., the electronic device 101 of FIG. 1) may include a fingerprint sensor (e.g., the sensor 130 of FIGS. 1 and 2) including a sensor having a sensor surface (e.g., the packaging 206 of FIG. 2) including EMC resin, a first layer (e.g., the UV bonding layer 220 of FIG. 2) disposed on the surface of the sensor or above the surface of the sensor (the first layer includes a first UV hardening material having first hardness) and a second layer (e.g., the UV coating layer 230 of FIG. 2) disposed on the first layer or above the first layer (the second layer includes a second UV hardening material having second hardness greater than the first hardness and a surface of the second layer has surface roughness less than a specified value.)

According to various embodiments, a ten-point mean roughness of the surface of the second layer may be less than 0.20 μm.

According to various embodiments, the second layer may include pigment or dye.

According to various embodiments, the second layer has light transmission.

According to various embodiments, the fingerprint sensor may further include a third layer (e.g., the deposition layer 225 of FIG. 4A) interposed between the first layer and the second layer. The third layer may include at least one of $SiO_2$, $TiO_2$, $Ti_3O_5$, $Al_2O_3$, Indium (In), Tin (Sn) or a polymeric material.

The fingerprint sensor may further include a fourth layer (e.g., the printing layer 223 of FIG. 4A) interposed between the third layer and the first layer, and the fourth layer may include at least one of an adhesive material, pigment or dye.

The fingerprint sensor may further include a fifth layer (e.g., the color painting layer 215 of FIG. 4A) interposed between the first layer and the surface of the sensor, and the fifth layer includes pigment or dye.

The fingerprint sensor may further include a sixth layer (e.g., the color painting layer 215 of FIG. 4A) interposed between the first layer and the surface of the sensor, and the sixth layer may include pigment or dye.

The fingerprint sensor may further include a seventh layer (e.g., the printing layer 223 of FIG. 4A) interposed between the first layer and the surface of the sensor, and the seventh layer may include pigment or dye.

According to various embodiments, the electronic device (e.g., the electronic device 101 of FIG. 1) may further include a display (e.g., the display 110 of FIG. 1). At least part of the second layer is at least partially exposed through a surface the same as an active area of the display. The part may form a physical button formed on a non-active area of the display.

According to various embodiments, the electronic device (e.g., the electronic device 101 of FIG. 1) may further include a display. At least part of the second layer is at least partially exposed through a surface different from an active area of the display.

According to various embodiments, an electronic device (e.g., the electronic device 101 of FIG. 1) may include housing (e.g., the housing 120 of FIG. 1) including at least one opening, a sensor (e.g., the sensor 130 of FIGS. 1 and 2) disposed inside the housing, a first layer (e.g., the UV bonding layer 220 of FIG. 2) disposed on a sensing surface of the sensor or above the sensing surface and a second layer (e.g., the UV coating layer 230 of FIG. 2), which is disposed above the first layer and at least part of which is exposed through the opening. The first layer may include a first UV hardening material having first hardness. The second layer may include a second UV hardening material having second hardness. The second layer may cause at least part of UV light input from the outside to pass through the first layer, and the second layer may have surface roughness less than a specified value. The second hardness may be greater than the first hardness.

According to various embodiments, the second layer may have a surface, a ten-point mean roughness (Rz) of which is less than 0.20 μm.

According to various embodiments, the electronic device (e.g., the electronic device 101 of FIG. 1) may further include a display (e.g., the display 110 of FIG. 1). At least part of the second layer is at least partially exposed through a surface the same as an active area of the display.

According to various embodiments, the sensor may form a physical button formed on a non-active area of the display.

According to various embodiments, an electronic device (e.g., the electronic device 101 of FIG. 1) may include a display (e.g., the display 110 of FIG. 1), housing surrounding the display and a sensor disposed inside the housing, the sensor may include a chip package, a first layer (e.g., the UV bonding layer 220 of FIG. 2) disposed above a sensing surface of the chip package, a second layer (e.g., the UV coating layer 230 of FIG. 2), which is disposed above the first layer and at least part of which is exposed through the housing. The first layer may include a first UV hardening material having first hardness. The second layer may include a second UV hardening material having second hardness. The second layer may cause at least part of UV light input from the outside to pass through the first layer, and the second layer may have surface roughness less than a specified value.

According to various embodiments, the ten-point mean roughness of the at least part of the second layer may be less than 0.20 μm.

Each of components (e.g., a module or a program) may include a single entity or a plurality of entities; some of the above-described corresponding sub components may be omitted, or any other sub component may be further included in various embodiments. Alternatively additionally, some components (e.g., a module or a program) may be combined with each other so as to form one entity, so that the functions of the components may be performed in the same manner as before the combination. According to various embodiments, operations executed by modules, program modules, or other components may be executed by a successive method, a parallel method, a repeated method, or a heuristic method. Alternatively, at least some of the operations may be executed in another order or may be omitted, or any other operation may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
 a housing; and
 a fingerprint sensor comprising:
  a sensor having a surface comprising an epoxy molding compound (EMC) resin,
  a first layer disposed on the surface of the sensor or above the surface of the sensor, the first layer comprising a first ultraviolet (UV) hardening material having a first hardness, and
  a second layer disposed on the first layer or above the first layer,
 wherein the second layer comprises a second UV hardening material having a second hardness greater than the first hardness and a surface of the second layer has surface roughness less than a specified value.

2. The electronic device of claim 1, wherein a ten-point mean roughness (Rz) value of the surface of the second layer is less than 0.20 µm.

3. The electronic device of claim 1, wherein the second layer comprises a pigment or a dye.

4. The electronic device of claim 1, wherein the second layer has a light transmission.

5. The electronic device of claim 1,
 wherein the fingerprint sensor further comprises:
  a third layer interposed between the first layer and the second layer, and
 wherein the third layer comprises at least one of $SiO_2$, $TiO_2$, $Ti_3O_5$, $Al_2O_3$, Indium (In), Tin (Sn), or a polymeric material.

6. The electronic device of claim 5,
 wherein the fingerprint sensor further comprises:
  a fourth layer interposed between the third layer and the first layer, and
 wherein the fourth layer includes at least one of an adhesive material, a pigment or a dye.

7. The electronic device of claim 5,
 wherein the fingerprint sensor further comprises:
  a fifth layer interposed between the first layer and the surface of the sensor, and
 wherein the fifth layer comprises a pigment or a dye.

8. The electronic device of claim 1,
 wherein the fingerprint sensor further comprises:
  a sixth layer interposed between the first layer and the surface of the sensor, and
 wherein the sixth layer comprises a pigment or a dye.

9. The electronic device of claim 6,
 wherein the fingerprint sensor further comprises:
  a seventh layer interposed between the first layer and the surface of the sensor, and
 wherein the seventh layer comprises a pigment or a dye.

10. The electronic device of claim 1, further comprising:
 a display,
 wherein at least part of the second layer is at least partially exposed through a surface same as an active area of the display.

11. The electronic device of claim 10, wherein the at least part of the second layer forms a physical button formed on a non-active area of the display.

12. The electronic device of claim 1, further comprising:
 a display,
 wherein at least part of the second layer is at least partially exposed through a surface different from an active area of the display.

13. An electronic device comprising:
 a housing comprising at least one opening;
 a sensor disposed inside the housing;
 a first layer disposed on a sensing surface of the sensor or above the sensing surface; and
 a second layer, which is disposed above the first layer and at least part of which is exposed through the at least one opening,
 wherein the first layer includes a first ultraviolet (UV) hardening material having a first hardness,
 wherein the second layer includes a second UV hardening material having a second hardness, the second hardness being different than the first hardness,
 wherein the second layer causes at least part of UV light input from outside the electronic device to pass through the first layer, and
 wherein the second layer has a surface roughness less than a specified value.

14. The electronic device of claim 13, wherein the second hardness is greater than the first hardness.

15. The electronic device of claim 13, wherein the second layer has a surface and a ten-point mean roughness (Rz) of which is less than 0.20 µm.

16. The electronic device of claim 13, further comprising:
 a display,
 wherein at least part of the second layer is at least partially exposed through a surface same as an active area of the display.

17. The electronic device of claim 16, wherein the sensor forms a physical button formed on a non-active area of the display.

18. An electronic device comprising:
 a display;
 a housing surrounding the display; and
 a sensor disposed inside the housing,
 wherein the sensor comprises:
  a chip package,
  a first layer disposed above a sensing surface of the chip package, and
  a second layer, which is disposed above the first layer and at least part of which is exposed through the housing,
 wherein the first layer comprises a first ultraviolet (UV) hardening material having a first hardness,
 wherein the second layer comprises a second UV hardening material having second hardness, the second hardness being different than the first hardness,
 wherein the second layer causes at least part of UV light input from outside the electronic device to pass through the first layer, and
 wherein the second layer has a surface roughness less than a specified value.

19. The electronic device of claim 18, wherein a ten-point mean roughness of the at least part of the second layer is less than 0.20 µm.

20. The electronic device of claim 18, wherein the second hardness is greater than the first hardness.

* * * * *